United States Patent
Wang

(10) Patent No.: US 7,971,113 B2
(45) Date of Patent: Jun. 28, 2011

(54) METHOD FOR DETECTING DISTURB PHENOMENA BETWEEN NEIGHBORING BLOCKS IN NON-VOLATILE MEMORY

(75) Inventor: Cheng-Pin Wang, Taoyuan County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 267 days.

(21) Appl. No.: 12/353,984

(22) Filed: Jan. 15, 2009

(65) Prior Publication Data
US 2010/0162057 A1 Jun. 24, 2010

(30) Foreign Application Priority Data
Dec. 22, 2008 (TW) ................................ 97150063 A

(51) Int. Cl.
*G11C 29/00* (2006.01)
(52) U.S. Cl. .................... 714/720; 714/2; 714/5; 714/6; 714/7; 714/8; 714/25; 714/42; 714/710; 714/715; 714/718; 714/719; 714/723; 714/799; 365/185.01; 365/201; 365/196; 365/185.92; 365/189.07; 365/185.11; 365/185.33; 711/103; 711/165
(58) Field of Classification Search ........................ None
See application file for complete search history.

(56) References Cited

U.S. PATENT DOCUMENTS

| | | | |
|---|---|---|---|
| 6,999,363 B2 * | 2/2006 | Chevallier | 365/201 |
| 7,818,525 B1 * | 10/2010 | Frost et al. | 711/165 |
| 2004/0015756 A1 * | 1/2004 | Chiu et al. | 714/719 |
| 2007/0255889 A1 * | 11/2007 | Yogev et al. | 711/103 |
| 2009/0109755 A1 * | 4/2009 | Edan et al. | 365/185.11 |
| 2009/0307412 A1 * | 12/2009 | Yeh | 711/103 |

OTHER PUBLICATIONS

Banerjee et al., "Built-In Self-Test for Flash Memory Embedded in SoC", IEEE, Third Workshop on Electronic Design, 2005, 6 pages.*

* cited by examiner

*Primary Examiner* — John P Trimmings
(74) *Attorney, Agent, or Firm* — Winston Hsu; Scott Margo

(57) ABSTRACT

A method for detecting disturb phenomena between neighboring blocks in non-volatile memory includes, sequentially erasing and writing test data (pattern) to each block of a plurality of blocks under test in the non-volatile memory at a first time point, dividing the plurality of blocks under test into a first block group and a second block group based on ordinal number included in each block of the plurality of blocks under test, reading data from each block of the first block group at a second time point, and comparing the data with the test data written at the first time point to generate a first detecting result, and determining applicability of each block of the first block group based on the first detecting result.

13 Claims, 3 Drawing Sheets

METHOD FOR DETECTING DISTURB PHENOMENA BETWEEN NEIGHBORING BLOCKS IN NON-VOLATILE MEMORY

BACKGROUND OF THE INVENTION

1. Field of the Invention

The present invention is related to a detecting method in a non-volatile memory, and more particularly, to a detecting method capable of detecting the disturb phenomena between neighboring blocks in the non-volatile memory.

2. Description of the Prior Art

Flash memory is a non-volatile memory which can perform numerous times of read and write functions. Meanwhile, as the data capacity of the flash memory increased, and the data access speed advanced, applications of the flash memory have been getting even more popular; from small-sized products, like memory card, keychain drive to larger-sized gadgets, like mobile phone, video game machine, digital camera and many other electronic devices, the flash memory almost exists in all kinds of product as a data storage device.

The flash memory comprises numerous cells, each having a specially designed floating gate, and according to principles of quantum mechanics, electronic charges can be transported into the floating gate by an effect known as tunnel injection, and the electronic charges can also be taken out of the floating gate by a reverse effect named tunnel release. The tunnel injection and the tunnel release jointly constitute the basic mechanism to store or erase data in the flash memory. Although the flash memory has many advantages in price and performance, according to its operating principles, the flash memory has a major limitation that it can only be accessed in blocks, which is similar to the data access method to a hard disk drive. On the other hand, the flash memory device might have manufacturing faults resulted from imperfections existing in the memory manufacturing process, such that data being written is inconsistent of data being read from the memory. Moreover, peculiar things could happen between neighboring blocks in the flash memory: data stored in a memory block can be unexpectedly altered by a neighboring block, while erase action(s) is applied to the neighboring block. This phenomena is generally referred as disturb (or crosstalk) phenomena of a flash memory.

Generally speaking, the detection method used for detecting manufacturing faults of a flash memory is for checking the data validity of a block itself, and not for checking the disturb phenomena between neighboring blocks. Basically, according to the prior art, the testing method generally comprises erasing memory blocks, writing data into memory blocks, reading the data out to check its validity by comparing the data being read, and then marking the failed block if the data is inconsistent. As can be understood, this kind of testing method is not designed for checking the disturb-type of manufacturing faults in the flash memory. Please refer to FIG. 1, which illustrates a schematic diagram of a flash memory 10. The flash memory 10 comprises Block_0~Block_2N of memory blocks, where a disturb phenomena exists between Block_K and Block_K+1. In other words, while the erase operation is applied to Block_K, a portion of data stored in Block_K+1 could be changed anomalously owing to the disturb phenomena. Meanwhile, if the erase operation is applied to Block_K+1, then data stored in Block_K could also be changed. Simply speaking, between neighboring blocks, say Block_K and Block_K+1, if a selected memory block is being erased, the data of the other neighboring block can be altered unwillingly through an electromagnetic action imposed by the block being erased. However, if the testing method of the prior art is adopted, the data in Block_K will not be changed by erasing and writing test data to Block_K itself, and the data in Block_K+1 will not be changed by erasing and writing test data to Block_K+1, either. The testing result will indicate Block_K and Block_K+1 are both functional (which are incorrect), and the disturb phenomena between Block_K and Block_K+1 cannot be effectively detected according to the prior art. In other words, the testing method in the prior art is improper to be used to detect the disturb-type manufacturing faults of the flash memory 10.

SUMMARY OF THE INVENTION

It is therefore a primary objective of the claimed invention to provide a detecting method capable of detecting the disturb phenomena between neighboring blocks in a non-volatile memory.

The present invention discloses a detecting method for detecting disturb phenomena between neighboring blocks in a non-volatile memory comprises sequentially erasing and writing a test pattern to each block of a plurality of blocks under test in the non-volatile memory at a first time point, dividing the plurality of blocks under test into a first block group and a second block group according to an ordinal number of each block of the plurality of blocks under test, reading data stored in each block in the first block group, checking whether the data is identical to the test pattern written at the first time point, and generating a first detecting result at a second time point, and determining applicability of each block in the first block group according to the first detecting result.

These and other objectives of the present invention will no doubt become obvious to those of ordinary skill in the art after reading the following detailed description of the preferred embodiment that is illustrated in the various figures and drawings.

DETAILED DESCRIPTION

According to the present invention, the non-volatile memory is preferably a NAND flash memory or other non-volatile memory being used in industry. Also, for the purpose of clarity, the memory blocks and their labels of the present invention are the same as those illustrated in FIG. 1.

Figure 2:
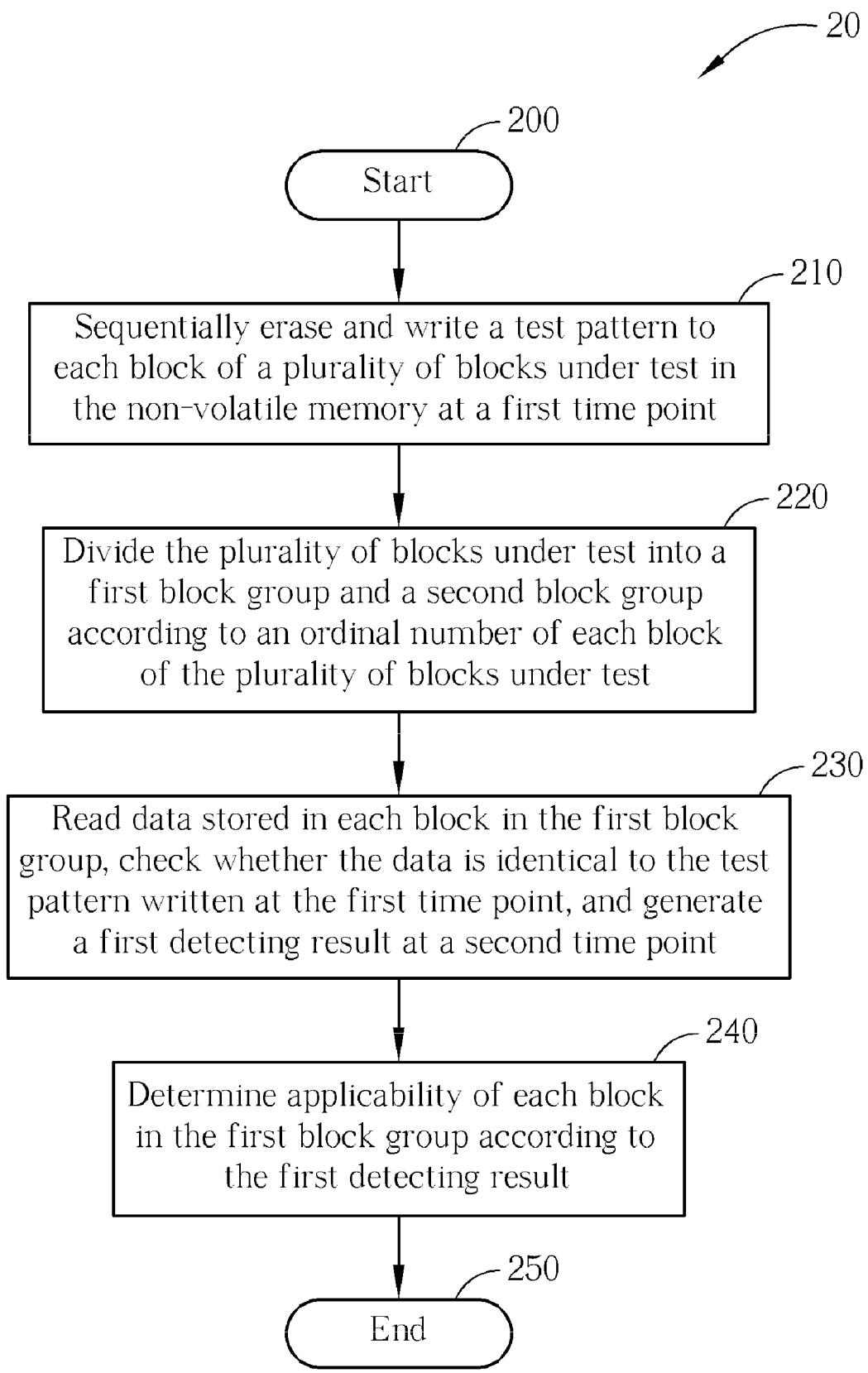
FIG. 2 illustrates a detecting process according to an embodiment of the present invention.

Please refer to FIG. 2, which illustrates a detecting process 20 according to an embodiment of the present invention. The detecting process 20 is used for detecting the disturb phenomena of neighboring blocks in a non-volatile memory. The process 20 comprises the following steps:

STEP 200: Start.

STEP 210: Sequentially erase and write a test pattern to each block of a plurality of blocks under test in the non-volatile memory at a first time point.

STEP 220: Divide the plurality of blocks under test into a first block group and a second block group according to an ordinal number of each block of the plurality of blocks under test.

STEP 230: Read data stored in each block in the first block group, check whether the data is identical to the test pattern written at the first time point, and generate a first detecting result at a second time point.

STEP 240: Determine applicability of each block in the first block group according to the first detecting result.

STEP 250: End.

According to process 20, the present invention is to sequentially erase and write a test pattern to each block of a plurality of blocks under test in the non-volatile memory at a first time point, and divide the plurality of blocks under test into a first block group and a second block group according to an ordinal number of each block of the plurality of blocks under test. Next, the present invention reads data stored in each block in the first block group, checks whether the data is identical to the test pattern written at the first time point, generates a first detecting result at a second time point, and determines applicability of each block in the first block group according to the first detecting result.

Figure 1:
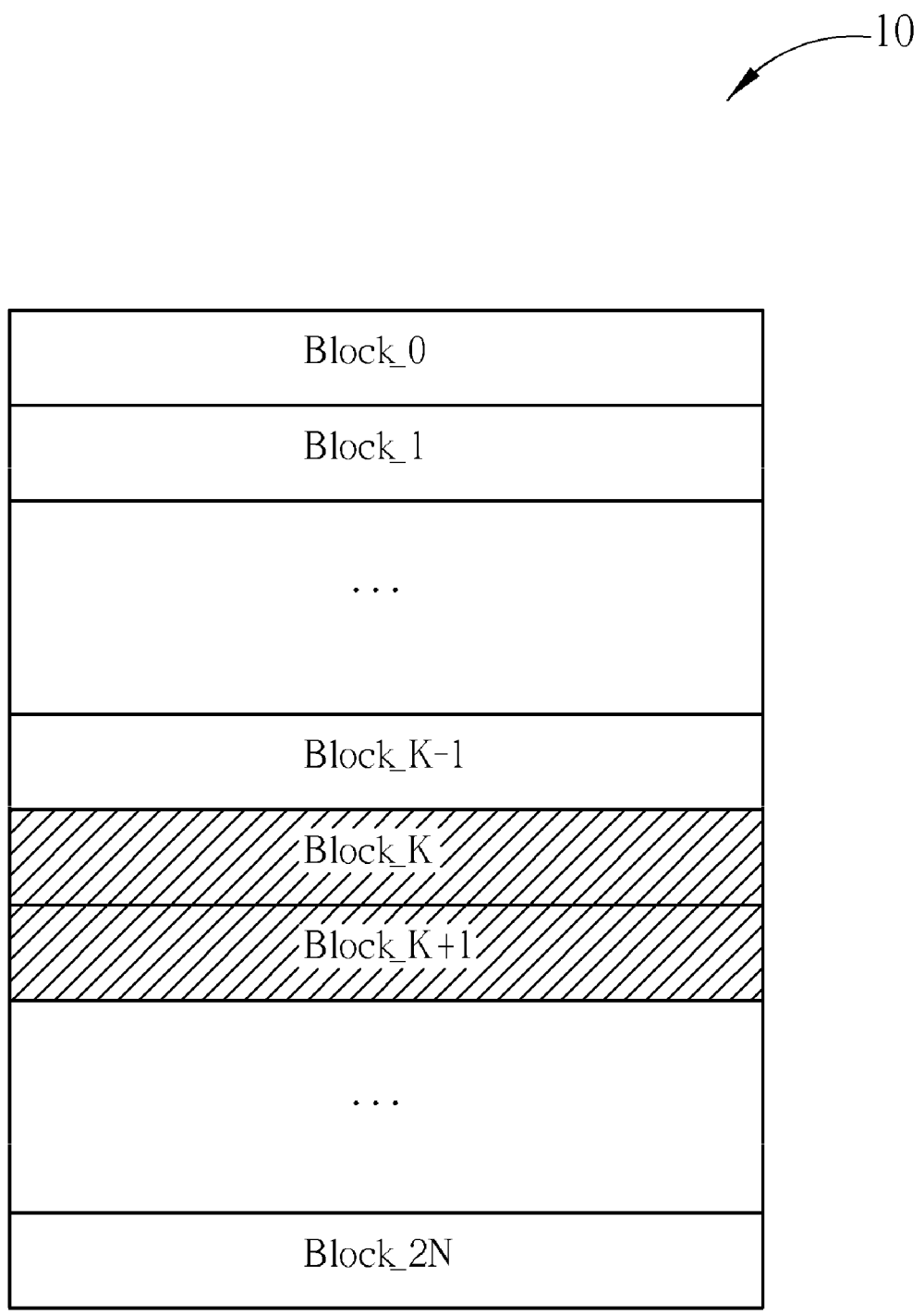
FIG. 1 illustrates a schematic diagram of the memory blocks of a flash memory.

Preferably, the first time point is prior to the second time point, the first block group comprises all the blocks with odd ordinal numbers, and the second block group comprises all the blocks with even ordinal numbers. Therefore, the process 20 erases and writes test data into Block_0 to Block_2N in sequence as shown in FIG. 1. Next, for blocks with odd ordinal number (Block_1, Block_3 . . . Block_(2N−1)), the process 20 reads and checks to determine whether the data are consistent with the data being written into the memory blocks. If, for a block Block_x, the data being read are fully consistent with the data being written into the block, then the process 20 will determine the block as a functional block; if not, the process 20 will determine it as a failed block. For example, Block_K and Block_K+1 are a couple of neighboring blocks which can disturb each other, and Block_K is prior than Block_K+1 to perform the erase and write action; consequently, the erase action of Block_K+1 will disturb the data validity of Block_K. And, if K is an odd number, then Block_K will be detected and determined to be a failed block. Noteworthily, for the pair of blocks with disturb type of manufacturing faults, say Block_K and Block_K+1, while one of the blocks is labeled as failed and no longer in use by the system, the other block can still be used. This is owing to the fact that if Block_K is marked as a failed block, the system will no longer apply erase action to Block_K, and Block_K+1 will not be affected by the disturb phenomena originated from Block_K. In this case, Block_K+1 can be used as a normal block. Therefore, for a pair of blocks Block_K and Block_K+1 with disturb phenomena, to mark only one of them as failed block would be well enough.

Besides, in the detecting process 20, the roles or functions of the two block groups with odd and even ordinal number can be exchanged. In other words, while the first block group comprises all the blocks with even ordinal number, and the second block group comprises all the blocks with odd ordinal number, the process 20 still applies.

Figure 3:
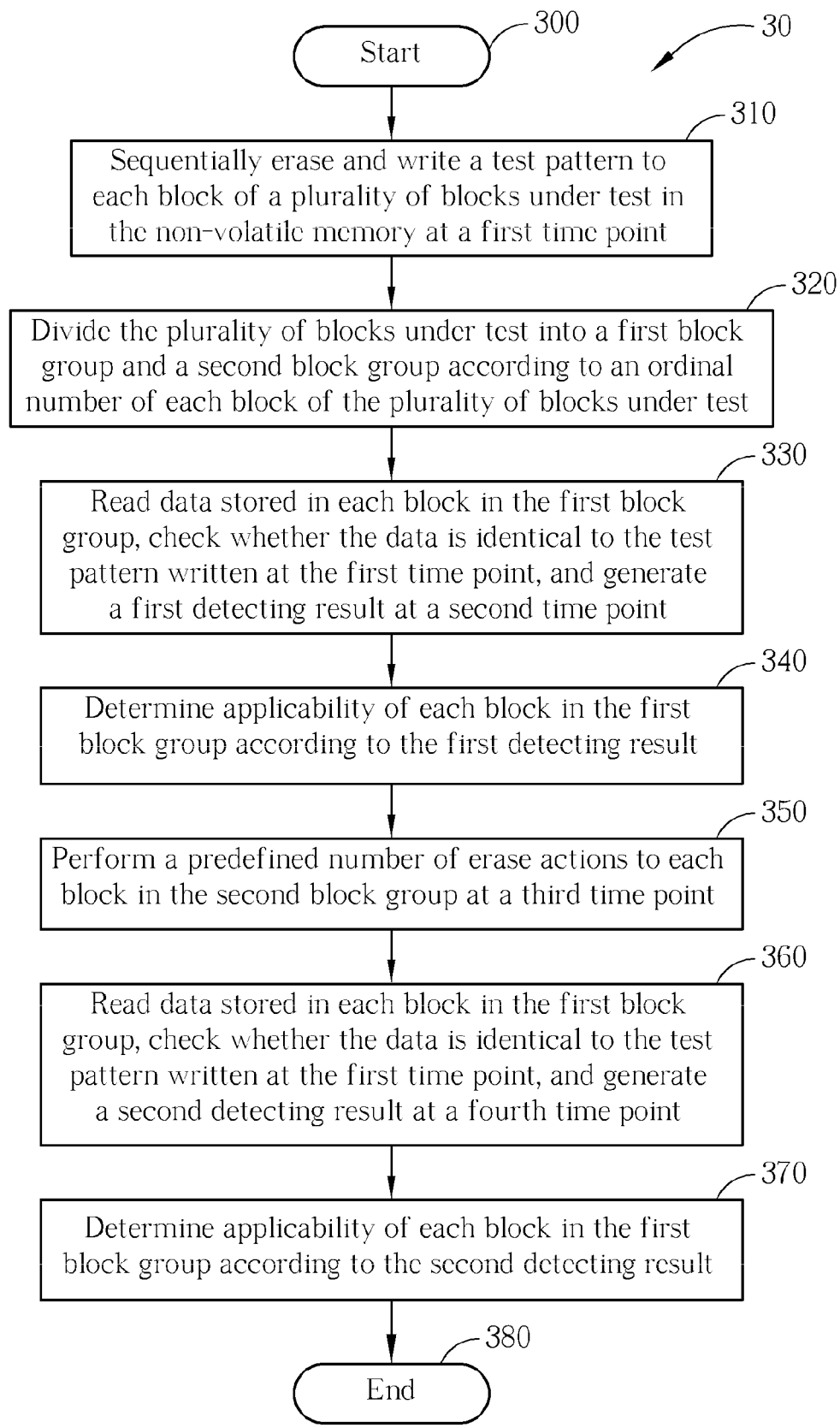
FIG. 3 illustrates a flowchart of a detecting process of an embodiment of the present invention.

As can be understood from the above description, the detecting process 20 provides a rapid and effective detecting method. Theoretically, the process 20 can find about half of the disturb-type manufacturing faults. If more precise detecting result is required by the system, the present invention can optionally perform a more complete debugging procedure. Please refer to FIG. 3, which illustrates a flowchart of a detecting process 30 according to an embodiment of the present invention. The detecting process 30 is used for detecting the disturb phenomena of neighboring blocks in a non-volatile memory. The process 30 comprises the following steps:

STEP 300: Start.

STEP 310: Sequentially erase and write a test pattern to each block of a plurality of blocks under test in the non-volatile memory at a first time point.

STEP 320: Divide the plurality of blocks under test into a first block group and a second block group according to an ordinal number of each block of the plurality of blocks under test.

STEP 330: Read data stored in each block in the first block group, check whether the data is identical to the test pattern written at the first time point, and generate a first detecting result at a second time point.

STEP 340: Determine applicability of each block in the first block group according to the first detecting result.

STEP 350: Perform a predefined number of erase actions to each block in the second block group at a third time point.

STEP 360: Read data stored in each block in the first block group, check whether the data is identical to the test pattern written at the first time point, and generate a second detecting result at a fourth time point.

STEP 370: Determine applicability of each block in the first block group according to the second detecting result.

STEP 380: End.

Inside the process 30, Steps 310~340 are identical to Steps 210~240, and won't be detailed further. On the other hand, preferably, the first time point is prior to the second time point, the second time point is prior to the third time point, and the third time point is prior to the fourth time point. Also, the first block group comprises all the blocks with odd ordinal number, and the second block group comprises all the blocks with even ordinal number. Therefore, after completing Step 310~340, the process 30 will apply multiple times of erase action to all of the blocks with even ordinal number, and check the data validity by reading and comparing the data of the blocks with odd ordinal numbers, and generate a corresponding checking result. If the checking result indicates that the data is consistent, the memory block is determined to be functional; otherwise, the block is determined to be a failed or a bad block.

Please refer to FIG. 1, given the condition that K is an even number, the disturb phenomena between Block_K and Block_K+1 can not be detected by performing Step 310~340. Alternatively, after performing several times of erase action to the blocks with even ordinal numbers, which includes Block_K, the disturb phenomena can be detected by checking Block_K+1, which is with an odd ordinal number, and can be detected by performing Steps 350~370. By doing so, the detecting process 30 is more complete than the process 20. Preferably, in the process 30, the roles or functions of the block group with odd and even ordinal number can be exchanged. In other words, while the first block group comprises all the blocks with even ordinal number, and the second block group comprises all the blocks with odd ordinal number, the process 30 still applies. Meanwhile, the non-volatile memory as described above is preferably a NAND flash memory, but is not limited to be so.

During the process 20 or 30 of memory testing, once the number of the failed blocks is greater than an upper limit given in the product specifications (usually the number of the redundant blocks should be greater than the number of failed blocks to be functional), the flash memory 10 will be considered as a defective part. Consequently, as the memory testing process 20 or 30 proceeds, once the number of the failed blocks is greater than the specified upper limit, the testing procedure for the chip under test can be set to be halted and the following testing procedure can be waived, such that the overall testing time can be shortened. On the other hand, under the condition that the flash memory 10 has already been used in a circuit, the present invention can also be used by the system to test the memory device, and the failed block(s) can be marked, such that the system can still use the blocks which are still functional, or take the redundant blocks to substitute the failed ones. By adding this function disclosed in the present invention to an electronic system in use, the disturb phenomena between neighboring blocks can be detected and avoided, and the data integrity can be improved.

To sum up, the present invention provides an effective solution to overcome the shortages of the prior art which detects the manufacturing faults of each individual block caused by the block itself, and fails to detect the disturb phenomena between neighboring blocks. Meanwhile, the present invention divides the blocks under test into blocks with the odd ordinal number and the even ordinal number; by using basic operations like read, write and erase, the present invention effectively detect the disturb phenomena between neighboring blocks.

Those skilled in the art will readily observe that numerous modifications and alterations of the device and method may be made while retaining the teachings of the invention.

What is claimed is:

1. A detecting method for detecting disturb phenomena between neighboring blocks in a non-volatile memory comprising:
   sequentially erasing and writing a test pattern to each block of a plurality of blocks under test in the non-volatile memory at a first time point;
   dividing the plurality of blocks under test into a first block group and a second block group according to an ordinal number of each block of the plurality of blocks under test;
   reading data stored in each block in the first block group, checking whether the data is identical to the test pattern written at the first time point, and generating a first detecting result at a second time point; and
   determining applicability of each block in the first block group according to the first detecting result;
   wherein each block in the second block group is applicable.

2. The detecting method of claim 1, wherein determining the applicability of each block in the first block group according to the first detecting result is determining a block of the first block group as a failed block when the first detecting result indicates that data stored in the block is not identical to the data written into the block at the first time point.

3. The detecting method of claim 2 further comprising replacing the failed block with a redundant block of the non-volatile memory.

4. The detecting method of claim 1, wherein the first time point is prior to the second time point.

5. The detecting method of claim 1 further comprising:
   performing a predefined number of erase actions to each block in the second block group at a third time point;
   reading data stored in each block in the first block group, checking whether the data is identical to the test pattern written at the first time point, and generating a second detecting result at a fourth time point; and
   determining applicability of each block in the first block group according to the second detecting result.

6. The detecting method of claim 5, wherein determining the applicability of each block in the first block group according to the second detecting result is determining a block of the first block group as a failed block when the second detecting result indicates that data stored in the block is not identical to the data written into the block at the first time point.

7. The detecting method of claim 6 further comprising replacing the failed block with a redundant block of the non-volatile memory.

8. The detecting method of claim 5, wherein the first time point is prior to the second time point, the second time point is prior to the third time point, and the third time point is prior to the fourth time point.

9. The detecting method of claim 1, wherein the first block group comprises all blocks with odd ordinal numbers.

10. The detecting method of claim 9, wherein the second block group comprises all blocks with even ordinal numbers.

11. The detecting method of claim 1, wherein the first block group comprises all blocks with even ordinal numbers.

12. The detecting method of claim 11, wherein the second block group comprises all blocks with odd ordinal numbers.

13. The detecting method of claim 1, wherein the non-volatile memory is a NAND flash memory.

* * * * *